(12) United States Patent
Pu et al.

(10) Patent No.: US 6,350,669 B1
(45) Date of Patent: Feb. 26, 2002

(54) METHOD OF BONDING BALL GRID ARRAY PACKAGE TO CIRCUIT BOARD WITHOUT CAUSING PACKAGE COLLAPSE

(75) Inventors: Han-Ping Pu, Taipei; Chien-Ping Huang, Hsinchu, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/699,888

(22) Filed: Oct. 30, 2000

(51) Int. Cl.$^7$ ................................................ H01L 21/44
(52) U.S. Cl. ...................... 438/613; 438/610; 438/650; 257/738; 257/778; 257/780; 174/256; 174/257; 174/263; 174/266
(58) Field of Search ............................... 438/613, 610, 438/650; 257/780, 738, 778; 174/266, 263, 256, 257

(56) References Cited

U.S. PATENT DOCUMENTS

| | | | |
|---|---|---|---|
| 5,459,287 A | * 10/1995 | Swamy | 174/266 |
| 5,463,191 A | * 10/1995 | Bell et al. | 174/263 |
| 5,541,368 A | * 7/1996 | Swamy | 174/266 |
| 5,587,885 A | * 12/1996 | Swamy | 361/777 |
| 5,591,941 A | 1/1997 | Acocella et al. | 174/266 |
| 5,841,198 A | 11/1998 | Chia et al. | 257/780 |

* cited by examiner

*Primary Examiner*—Richard Elms
*Assistant Examiner*—Pho Luu
(74) *Attorney, Agent, or Firm*—Peter F. Corless; Steve M. Jensen; Edwards & Angell, LLP

(57) ABSTRACT

A method is proposed for bonding a BGA (Ball Grid Array) package to a circuit board without causing the collapsing of the BGA package against the circuit board. The proposed method is characterized in the use of two groups of solder balls of different reflow collapse degrees, which are arranged in an interspersed manner among each other in the ball grid array. In one embodiment, the first group of solder balls are homogenously made of a solder material of a specific melting point; and the second group of solder balls each include an outer portion and a core portion, with the outer portion having substantially the same melting point as the first group of solder balls, and the core portion being greater in melting point than the outer portion. In another embodiment, the second group of solder balls are greater in melting point than the first group of solder balls. During the solder-reflow process, when the first group of solder balls are entirely melted, the second group of solder balls are only partly melted or entirely unmelted and thus are capable of providing a solid support to the BGA package to prevent the collapsing of BGA package against circuit board.

17 Claims, 3 Drawing Sheets

METHOD OF BONDING BALL GRID ARRAY PACKAGE TO CIRCUIT BOARD WITHOUT CAUSING PACKAGE COLLAPSE

BACKGROUND OF THE INVENTION

1. Field of the Invention

This invention relates to integrated circuit packaging, technology, and more particularly, to a method of bonding a BGA Hall Grid Array) package to a circuit board without causing collapse of the BGA package against the circuit board.

2. Description of Related Art

BGA (Ball Grid Array) is an advanced type of integrated circuit packaging technology which is characterized in the use of a substrate whose front side is mounted with a semiconductor chip and whose back side is mounted with a grid array of solder balls. During SMT (Surface Mount Technology) process, the BGA package can be mechanically bonded and electrically coupled to a printed circuit board (PCB) by means of these solder balls.

FIGS. 1A–1C are schematic sectional diagrams used to depict a conventional method for bonding a BGA package to a circuit board.

Referring first to FIG. 1A, this method is used to bond a BGA package 100 to a circuit board 110. The BGA package, 100 is formed with a plurality of bond pads 101 on the back side thereof (which are hereinafter referred to as package-side bond pads); while the circuit board 110 is formed with a plurality of corresponding bond pads 111 (which are hereinafter referred to as board-side bond pads), each being associated with one of the package-side bond pads 101.

During the SMT process, the first step is to prepare a grid array of solder balls 120, which are typically made of Pb/Sn 37/63 (which stands for 37% of lead and 63% of tin), and which are disposed between the package-side bond pads 101 and the corresponding board-side bond pads 111.

Referring further to FIG. 1B, in the next step, a solder-reflow process is performed by heating the solder balls 120 at the melting point of the solder balls 120, so as to melt the solder balls 120 to make them reflow over the board-side bond pads 111. Through this process, the solder balls 120 are wetted to both the package-side bond pads 101 and the board-side bond pads 111, thereby bonding the BGA package 100 to the circuit board 110.

One problem in the forgoing SMT process, however, is that, since the solder balls 120 are highly deformable when melted, the fixation of the BGA package 100 above the circuit board 110 should be carefully maintained; otherwise, the BGA package 100 would easily collapse against the circuit board 110.

As illustrated in FIG. 1C, in the event that the BGA package 100 is pressed down, or the BGA package 100 is unflatly shaped in its back side, it would undesirably cause the melted solder balls 120 to be crushed down and spread out beyond the board-side bond pads 111 which may even cause the solder balls 120 to come into contact with adjacent ones and thus become short-circuited to each other.

The U.S. Pat. No. 5,841,198 entitled "BALL GRID ARRAY PACKAGE EMPLOYING SOLID CORE SOLDER BALLS" teaches the use of solid-core solder balls to prevent the collapsing of BGA package against circuit board during the solder-reflow process. The utilization of this patented technology, however, has the following drawbacks. First, the solid-core solder balls are considerably more expensive to manufacture than conventional homogenous solder balls, so that it would make the overall packaging process much more costly to implement. Second, since these solid-core solder balls are hardly collapsible, it requires the BGA substrate surface to be highly planarized, which would make the overall packaging process more difficult to carry out.

The U.S. Pat. No. 5,591,941 entitled "SOLDER BALL INTERCONNECTED ASSEMBLY" teaches the use of high melting temperature solder balls together with low melting temperature solder paste to provide reliable bonding between BGA package and circuit board. This patented technology, however, is not intended to prevent the collapsing of BGA package against circuit board during solder-reflow process.

SUMMARY OF THE INVENTION

It is therefore an objective of this invention to provide a new method for bonding a BGA package to a circuit board, which can help prevent the collapsing of BGA package against circuit board during solder-reflow process.

It is another objective of this invention to provide a new method for bonding a BGA package to a circuit board, which can help prevent the solder balls from short-circuiting to adjacent ones during solder-reflow process.

In accordance with the foregoing and other objectives, the invention proposes a new method for bonding a BGA package to a circuit board.

Broadly recited, the method of the invention comprises the following steps: (1) preparing paring a grid array of solder tats, including: a fist group of solder balls of a specific reflow collapse degree; and a second group of solder balls of a specific reflow collapse degree less than the reflow collapse degree of the first group of solder balls; (2) arranging the first and second groups of solder balls in an interspersed manner in the grid array; (3) attaching the first and second groups of solder balls to corresponding bond pads on the BGA package and the circuit board; and (4) performing a solder-reflow process to reflow the first and second groups of solder balls over their associated bond pads on the circuit board.

In the first preferred embodiment, the first group of solder balls are homogenously made of a solder material of a specific melting point; and the second group of solder balls are each of the type including an outer portion and a core portion, with the outer portion having substantially the same melting point as the first group of solder balls, and the core portion being greater in melting point than the outer portion.

In the second preferred embodiment, the first group of solder balls are homogenously made of a first solder material of a specific melting point; and the second group of solder balls are homogeneously made of a second solder material whose melting point is greater than the melting point of the first group of solder balls.

During the solder-reflow process, when the first group of solder balls are entirely melted, the second group of solder balls are only partly melted (in the case of the first preferred embodiment) or entirely unmelted (in the case of the second preferred embodiment); and therefore, the second group of solder balls are capable of providing a firm support to the BGA package to prevent the collapsing of BGA package against circuit board during solder-reflow process.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The method according to the invention for bonding a BGA package to a circuit board is disclosed in full details by way of two preferred embodiments in the following with reference to FIGS. 2A–2C and FIGS. 3A–3C respectively.

Figure 1A:
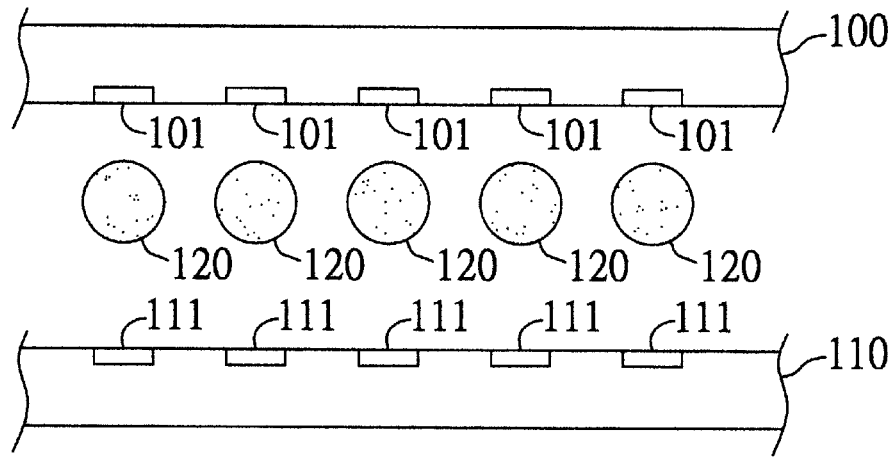
FIGS. 1A–1C (PRIOR ART) are schematic sectional diagrams used to depict a conventional method for bonding a BGA package to a circuit board.
Figure 1B:
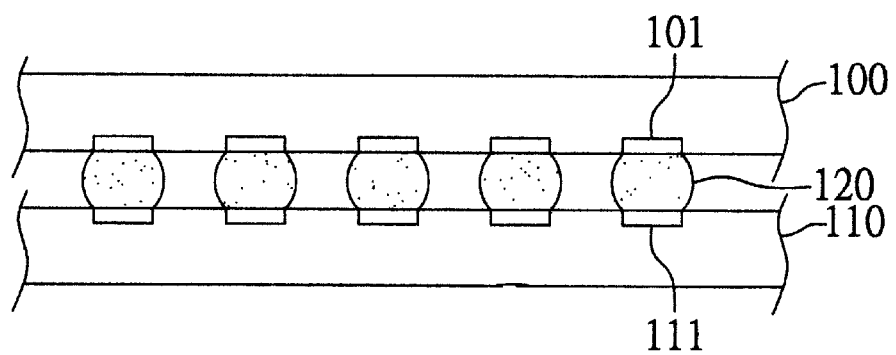
Figure 1C:
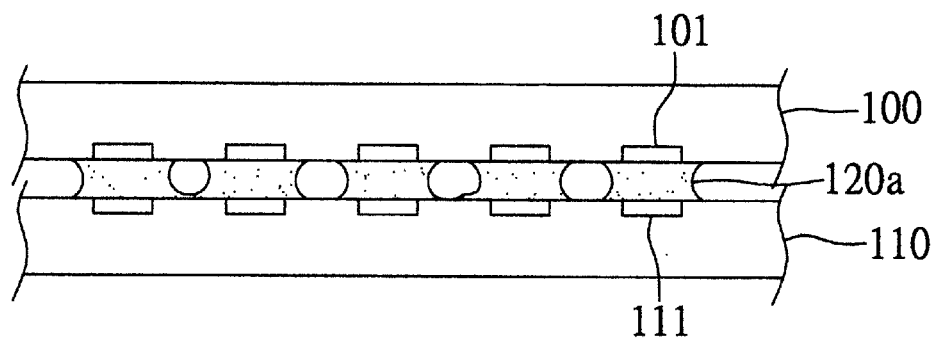
Figure 2A:
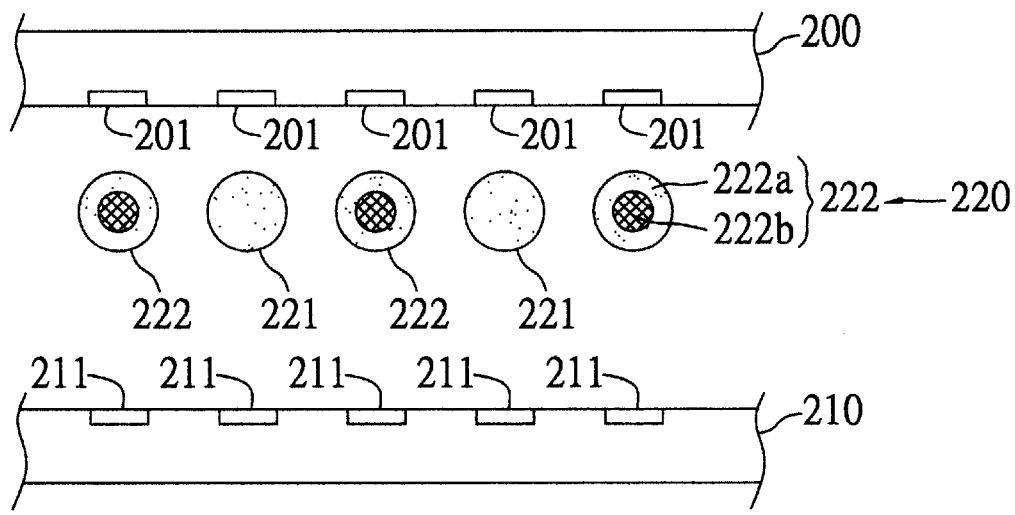
FIGS. 2A–2C are schematic sectional diagrams used to depict a first, preferred embodiment of the method of the invention for bonding a BGA package to a circuit board.
Figure 2B:
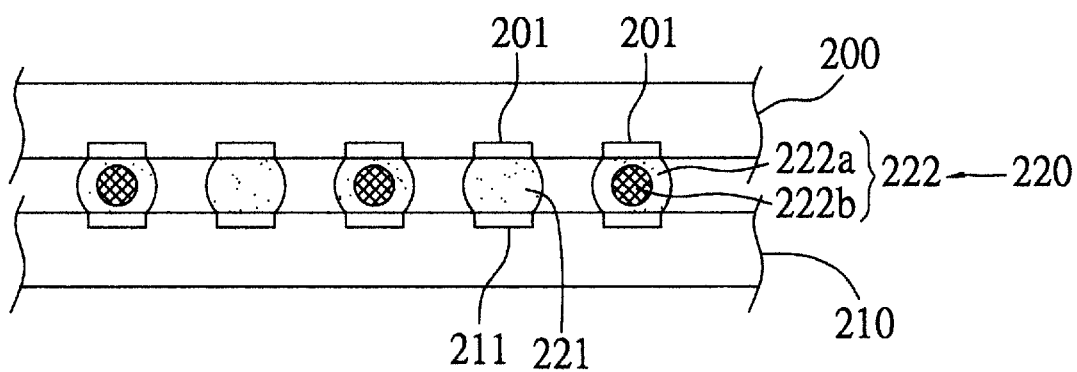
Figure 2C:
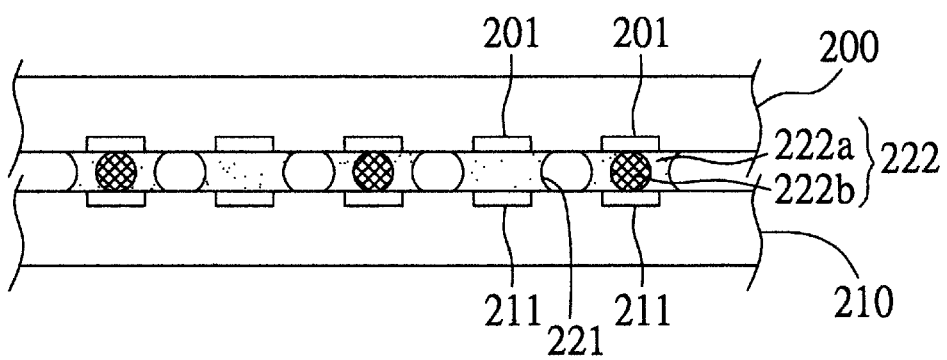

First Preferred Embodiment (FIGS. 2A–2C)

The first preferred embodiment of the method of the invention is disclosed in full details in the following with reference to FIGS. 2A–2C.

Referring first to FIG. 2A, in this embodiment, the method of the invention is utilized to bond a BGA package 200 to a circuit board 210. The BGA package 200 is formed with a plurality of bond pads 201 on the back side thereof (which are hereinafter referred to as package-side bond pads); while the circuit board 210 is formed with a plurality of corresponding bond pads 211 (hereinafter referred to as board-side bond pads), each being associated with one of the package-side bond pads 201.

It is a characteristic feature of the invention to provide a grid array of solder balls 220 including a first group of solder balls 221 and a second group of solder balls 222 arranged in an interspersed manner among the first group of solder balls 221. The first group of solder balls 221 are each homogeneously made of a single kind of solder material of a low melting point, such as Pb/Sn 37/63. By contrast, the second group of solder balls 222 are each formed with an outer portion 222a and a core portion 222b, with the outer portion 222a being made of a solder material having substantially the same melting point as the first group of solder balls 221, such as Pb/Sn 37/63, and the core portion 222b being made of a solder material that is greater in melting point than the outer portion 222a, such as copper (Cu) or Pb/Sn 95/5 (95% of lead and 5% of tin), and having a predetermined diameter.

Referring further to FIG. 2B, in the next step, a solder-reflow process is performed by heating the entire ball grid array 220 at a temperature equal to or greater than the melting point of the first group of solder balls 221 and the outer portion 222a of the second group of solder balls 222 but less than the melting point of the core portion 222b of the second group of solder balls 222. This temperature would melt the whole entirety of the first group of solder balls 221 but only the outer portion 222a of the second group of solder balls 222, while leaving the core portion 222b of the second group of solder balls 222 unmelted. As a result, the whole entirety of the first group of solder balls 221 and only the outer portion 222a of the second group of solder balls 222 are reflowed over their respective board-side bond pads 211.

As further illustrated in FIG. 2C, in the event that the BGA package 200 is forcefullly pressed down against the circuit board 210 during the solder-reflow process, the core portion 222b of the second group of solder balls 222 can each function as a rigid spacer to firmly support the BGA package 200 above the circuit board 210, thereby preventing the collapsing of the BGA package 200 against the circuit board 210.

Figure 3A:
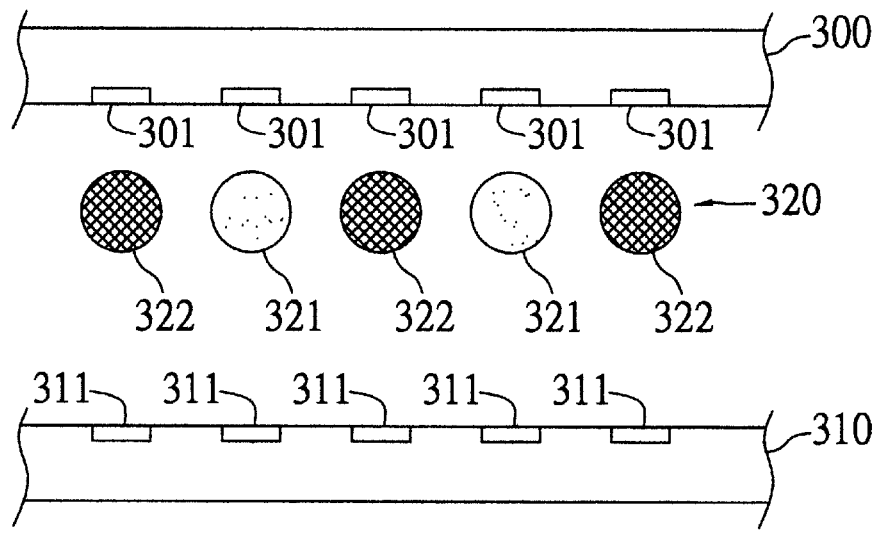
FIGS. 3A–3C are schematic sectional diagrams used to depict a second preferred embodiment of the method of the invention for bonding a BGA package to a circuit board.
Figure 3B:
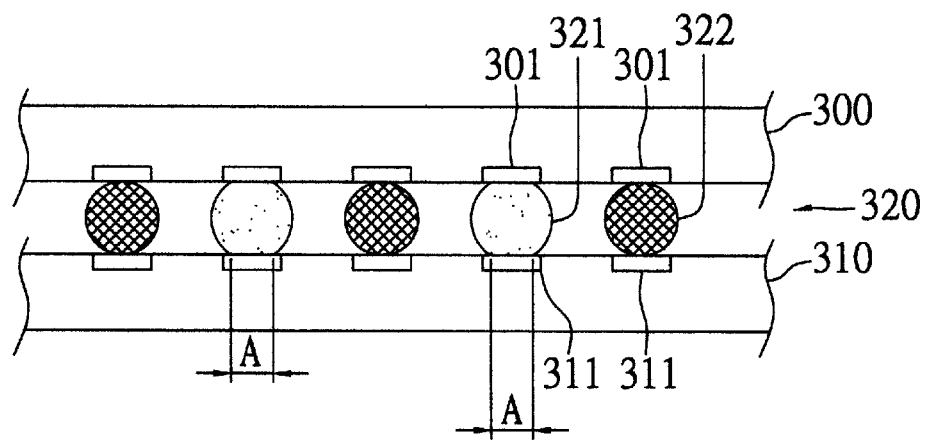
Figure 3C:
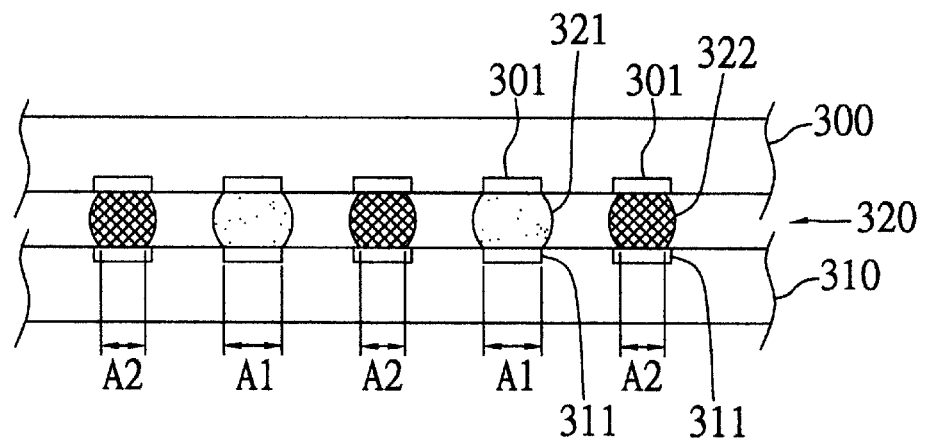

Second Preferred Embodiment (FIGS. 3A–3C)

The second preferred embodiment of the method of the invention is disclosed in full details in the following with reference to FIGS. 3A–3C.

Referring to FIG. 3A, in this embodiment, the invention is utilized to bond a BGA package 300 to a circuit board 310. The BGA package 300 is formed with a plurality of bond pads 301 on the back side thereof (which are hereinafter referred to as package-side bond pads); while the circuit board 316 is formed with a plurality of corresponding bond pads 311 (hereinafter referred to as board-side bond pads), each being associated with one of the package-side bond pads 301.

It is a characteristic feature of the invention to provide a grid array of solder balls 320 including a first group of solder balls 321 and a second group of solder balls 322 arranged in an interspersed manner among the first group of solder balls 321. The first group of solder balls 321 are identical in volume as the second group of solder balls 322.

This embodiment differs from the previous one particularly in that the second group of solder balls 322 are greater in melting point than the first group of solder balls 321, preferably by a difference of at least 10° C. (Celsius). In this embodiment, for example, the first group of solder balls 321 are made of Pb/Sn 37/63, while the second group of solder balls 322 are made of Pb/Sn 95/5.

Referring further to FIG. 3B, in the next step, a first solder-reflow process is performed by heating the entire ball grid array 320 at a first temperature equal to or greater than the melting point of the first group of solder balls 321 but less than the melting point of the second group of solder balls 322, thereby melting down the first group of solder balls 321 while leaving the second group of solder balls 322 unmelted, causing only the first group of solder balls 321 to reflow. The first solder-reflow process is interrupted when the board-side bond pads 311 are partly wetted by the first group of solder balls 321 to a predetermined area A.

During the first solder-reflow process, since the second group of solder balls 322 are unmelted, they are still solid to function as a firm support to the BGA package 300, thereby preventing the collapsing of the BGA package 300 against the circuit board 310.

Referring further to FIG. 3C, in the next step, a second solder-reflow process is performed by heating the ball grid array 320 at a second temperature equal to or greater than the melting point of the second group of solder balls 322, thereby causing both the first group of solder balls 321 and the second group of solder balls 322 to be melted. This allows the first group of solder balls 321 to be further widely wetted to their associated board-side bond pads 311 and the second group of solder balls 322 to start to reflow over their associated board-side bond pads 311. As a result, the pad joint area $A_1$ of the first group of solder balls 321 would be greater than the pad joint area $A_2$ of the second group of solder balls 322. Since the first group of solder balls 321 and the second group of solder balls 322 are equally sized, the reflowed second group of solder balls 322 would be, greater in height than the reflowed first group of solder balls 321; and therefore, the second group of solder balls 322 are capable of supporting the BGA package 300 above the circuit board 310, thereby preventing the collapsing of the BGA package 300 against the circuit board 310.

CONCLUSION

In conclusion, the invention provides a new method for bonding a BGA package to a circuit board, which can help prevent the collapsing of BGA package against circuit board during solder-reflow process. During the solder-reflow process, when the first group of solder balls are entirely melted, the second group of solder balls are only partly melted (in the case of the first preferred embodiment) or entirely unmelted (in the case of the second preferred embodiment); and therefore, the second group of solder balls are capable of providing a firm support to the BGA package to prevent the collapsing of BGA package against circuit board during solder-reflow process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for bonding a BGA package to a circuit board, comprising the steps of:
   (1) preparing a grid array of solder balls, including:
       a first group of solder balls of a specific reflow collapse degree; and
       a second group of solder balls of a specific reflow collapse degree less than the reflow collapse degree of the first group of solder balls;
   (2) arranging the first and second groups of solder balls in an interspersed manner in the grid array;
   (3) attaching the first and second groups of solder balls to corresponding bond pads on the BGA package and the circuit board; and
   (4) performing a solder-reflow process to reflow the first and second groups of solder balls over associated bond pads on the circuit board.

2. The method of claim 1, wherein in said step (1),
   the first group of solder balls are homogenously made of a solder material of a specific melting point; and
   the second group of solder balls each include an outer portion and a core portion, with the outer portion having substantially thee same melting point as the first group of solder balls, and the core portion being greater in melting point than the outer portion.

3. The method of claim 2, wherein the first group of solder balls are each made of Pb/Sn 37/63.

4. The method of claim 2, wherein the outer portion of each of the second group of solder balls is made of Pb/Sn 37/63, while the core portion of the same is made of copper.

5. The method of claim 2, wherein the outer portion of each of the second group of solder balls is made of Pb/Sn 37/63, while the core portion of the same is made of Pb/Sn 95/5.

6. The method of claim 1, wherein in said step (4), the solder-reflow process comprises:
   (4-1) heating the first and second groups of solder balls at a temperature equal to or greater than the melting point of the first group of solder balls but less than the melting point of the core portion of the second group of solder balls, causing the first group of solder balls and the outer portion of the second group of solder balls to reflow over associated bond pads on the circuit board.

7. The method of claim 1, wherein in said step (1),
   the first group of solder balls are made of a first solder material of a specific melting point; and
   the second group of solder balls are made of a second solder material, and which are greater in melting point than the first group of solder balls.

8. The method of claim 7, wherein the melting point of the second group of solder balls is at least 10° C. greater than the melting point of the first group of solder balls.

9. The method of claim 7, wherein the first group of solder balls are made of Pb/Sn 37/63, while the second group of solder balls are made of Pb/Sn 95/5.

10. The method of claim 7, wherein in said step (4), the solder-reflow process comprises:
    (4-1) heating the ball grid array at a first temperature equal to or greater than the melting point of the first group of solder balls but less than the melting point of the second group of solder balls, causing only the first group of solder balls to reflow over associated bond pads on the circuit board; and
    (4-2) heating the ball grid array at a second temperature equal to or greater than the melting point of the second group of solder balls, causing both the first group of solder balls and the second group of solder balls to be melted down, thereby allowing the first group of solder balls to further reflow over associated bond pads on the circuit board and the second group of solder balls to reflow over associated bond pads on the circuit board.

11. A method for bonding a BGA package to a circuit board, comprising the steps of:
    (1) preparing a grid array of solder balls, including:
        a first group of solder balls homogenously made of a solder material of a specific melting point;
        a second group of solder balls, each including an outer portion and a core portion, with the outer portion having substantially the same melting point as the first group of solder balls, and the core portion being greater in melting point than the outer portion;
    (2) arranging the first and second groups of solder balls in an interspersed manner in the grid array;
    (3) attaching the first and second groups of solder balls to corresponding bond pads on the BGA package and the circuit board; and
    (4) heating the first and second groups of solder balls at a temperature equal to or greater than the melting point of the first group of solder balls but less than the melting point of the core portion of the second group of solder balls, causing the first group of solder balls and the outer portion of the second group of solder balls to reflow over associated bond pads on the circuit board.

12. The method of claim 11, wherein in said step (1), the first group of solder balls are each made of Pb/Sn 37/63.

13. The method of claim 11, wherein in said step (1), the outer portion of each of the second group of solder balls is made of Pb/Sn 37/63, while the core portion of the same is made of copper.

14. The method of claim 11, wherein in said step (1), the outer portion of each of the second group of solder balls is made of Pb/Sn 37/63, while the core portion of the same is made of Pb/Sn 95/5.

15. A method for bonding a BGA package to a circuit board, comprising the steps of:
    (1) preparing a grid array of solder balls, including:
        a first group of solder balls of a specific melting point; and
        a second group of solder balls of a specific melting point greater than the melting point of the first group of solder balls;
    (2) arranging the first and second groups of solder balls in an interspersed manner in the grid array;
    (3) attaching the first and second groups of solder balls to corresponding bond pads on the BGA package and the circuit board;

(4) heating the ball grid array at a first temperature equal to or greater than the melting point of the first group of solder balls but less than the melting point of the second group of solder balls, causing only the first group of solder balls to reflow over associated bond pads on the circuit board; and (5) heating the ball grid array at a second temperature equal to or greater than the melting point of the second group of solder balls, causing both the first group of solder balls and the second group of solder balls to be melted down, thereby allowing the first group of solder balls to further reflow over associated bond pads on the circuit board and the second group of solder balls to reflow over associated bond pads on the circuit board.

16. The method of claim 15, wherein the melting point of the second group of solder balls is at least 10° C. greater than the melting point of the first group of solder balls.

17. The method of claim 15, wherein the first group of solder balls are made of Pb/Sn 37/63, while the second group of solder balls are made of Pb/Sn 95/5.

* * * * *